(12) United States Patent
Fujisawa et al.

(10) Patent No.: US 6,911,678 B2
(45) Date of Patent: Jun. 28, 2005

(54) GLASS-SEALED LIGHT-EMITTING DIODE

(75) Inventors: Shigeo Fujisawa, Tokyo (JP); Iwao Shoji, Tokyo (JP); Toshifumi Watanabe, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/658,973

(22) Filed: Sep. 10, 2003

(65) Prior Publication Data

US 2004/0238838 A1 Dec. 2, 2004

(30) Foreign Application Priority Data

May 30, 2003 (JP) ........................................ 2003-154409

(51) Int. Cl.$^7$ .............................................. H01L 33/00
(52) U.S. Cl. ........................................ 257/100; 257/99
(58) Field of Search ........................... 257/99, 91, 100; 313/512

(56) References Cited

U.S. PATENT DOCUMENTS 5,475,241 A * 12/1995 Harrah et al. ................. 257/99

FOREIGN PATENT DOCUMENTS

| JP | 60-098687 | * | 6/1985 | ........... H01L/33/00 |
| JP | 61-067971 | * | 4/1986 | ........... H01L/33/00 |

* cited by examiner

*Primary Examiner*—Minh-Loan Tran
(74) *Attorney, Agent, or Firm*—Weingarten, Schurgin, Gagnebin & Lebovici LLP

(57) ABSTRACT

A surface-mountable glass-sealed light-emitting diode is provided. It has high reliability and high external quantum efficiency, and can achieve a low-cost components-implemented board. An LED bare chip (1) has opposite surfaces, which are provided with electrodes (2) for supplying power from external. A pair of dumet wires (3) are separately connected to the respective electrodes (2) sandwiching the LED bare chip (1) therebetween. The LED bare chip (1), the electrodes (2) and parts of the dumet wires (3) are integrally glass-sealed (4). A pair of metallic disc plates (6) have holes (5) formed through the center. They are secured on both sides of the glass seal (4) and solder-plated, allowing the pair of dumet wires (3) projected from the glass seal to pass through the holes (5).

3 Claims, 2 Drawing Sheets

PRIOR ART

GLASS-SEALED LIGHT-EMITTING DIODE

BACKGROUND OF THE INVENTION

1. Field of the Invention

The present invention relates to a surface-mountable glass-sealed light-emitting diode including a glass-sealed LED bare chip.

2. Description of the Related Art

In a conventional glass-sealed light-emitting diode (LED), for example, a pair of leads 33 are connected to anode and cathode electrodes of an LED bare chip 31, respectively, as shown in FIG. 4. A glass seal 32 is employed to integrally cover connections between the LED bare chip 31 and electrodes and the leads 33 for hermetic sealing. In the light-emitting diode 30 thus configured, when power is supplied through the leads 33 to the LED bare chip 31, an active region thereof emits light, which is guided from the side of the LED bare chip 31 through the glass seal 32 and output to external. There is an incident light that is emitted from the active region in the LED bare chip 31 and arrives at an interface between the LED bare chip 31 and the glass seal 32. This incident light has an angle (incident angle) from the normal to the interface at the incident point. If the incident angle is smaller than a critical angle, the light arrived at the interface is output from the LED bare chip 31 into the glass seal 32. If it is larger than the critical angle, the light is reflected back to the LED bare chip 31 and can not be output into the glass seal 32. In comparison of glass with air as materials that form interfaces with the LED bare chip, glass has a relatively larger refractive index and therefore a relatively larger critical angle. This means that a light can be output from the LED bare chip without being reflected at a larger incident angle from the interface with glass compared to air. When glass is selected as a material that adjoins the LED bare chip because it has a larger refractive index compared to air, a ratio of light output from the LED bare chip 31 can be increased relative to the total light emitted from the active region in the LED bare chip 31. This is effective to improve the external quantum efficiency (light-extraction efficiency). (For example, see Patent Document 1: Japanese Patent Application Laid-Open No. 61-67971, page 2, FIG. 1).

The above-described glass-sealed light-emitting diode includes leads for supplying power from external to drive the light-emitting diode. The leads extend outward from both sides of the light-emitting diode. When such the light-emitting diode is implemented on a printed circuit board, the leads are inserted into through-holes in a double-sided through-hole printed-circuit board and soldered to achieve fixation and electrical conduction. Recently, as electronic instruments are downsized and light-weighted, it is also intensively promoted to address downsizing and surface mounting of electronic components. In order to make the conventional glass-sealed light-emitting diode support surface mounting, it is required to mount surface mounting components other than the light-emitting diode on the double-sided through-hole printed-circuit board by a method of reflow or dip soldering and then the light-emitting diode by a method of manual soldering. Alternatively, it is required to use a high-temperature solder to solder the surface mounting components and then use a lower melting point solder to solder the light-emitting diode by a method of dip soldering. When these methods are employed to implement the conventional light-emitting diode on the same substrate together with the surface mounting components, they cause the following problems:

(1) When only the surface mounting components are implemented, a single-sided board with circuits formed only on one side functions sufficiently. In contrast, when the conventional light-emitting diode is mixed together, a double-sided through-hole board with circuits formed on both sides is required, which increases the cost of the printed circuit board.

(2) After the surface mounting components are implemented on the printed circuit board, it is required to solder the conventional light-emitting diode additionally. This requirement increases the number of processes for mounting components on the printed circuit board and elevates the production cost.

(3) When a high-temperature solder is used to solder the surface mounting components and then a lower melting point solder is used to solder the light-emitting diode by the method of dip soldering, the second soldering may impart stress to the surface mounting components and badly influences on the reliability.

The present invention has been made in consideration of the above problems and has an object to provide a glass-sealed light-emitting diode capable of achieving a high reliability and a high external quantum efficiency as an optical semiconductor component, and a high reliability and a low cost as for a components-implemented printed-circuit board.

SUMMARY OF THE INVENTION

To solve the above problems, a first aspect of the present invention is directed to a glass-encapsulated light-emitting diode, which comprises an LED bare chip; a pair of electrodes each connected to the LED bare chip on an opposite side thereof; a pair of leads each connected to the electrodes and thereby arranged for the LED bare chip to be interposed between the leads along an electrode direction; and a pair of metallic member each connected to an other end of the leads, wherein the LED bare chip including the electrodes and at least a part of the leads are integrally encapsulated with glass to produce the glass-encapsulated light-emitting diode, and the metallic members are separately secured at both ends of the glass-encapsulated light-emitting diode.

According to a second aspect of the invention, each lead, in the first aspect, is designed not to project out beyond the metallic member.

According to a third aspect of the invention, glass for the glass-encapsulated light-emitting diode, in any one of the first and second aspects, is composed of soft glass.

According to a third aspect of the invention, in any one of the first through third aspects, solder-plating is applied on at least each outermost side of glass-encapsulated light-emitting diode in an extending direction of the leads. The solder-plated outermost side comprises at least a portion of the solder-plated metallic member.

BRIEF DESCRIPTION OF THE DRAWINGS

The present invention will be more fully understood from the following detailed description with reference to the accompanying drawings, in which.

DETAILED DESCRIPTION OF THE PREFERRED EMBODIMENTS

Figure 1:
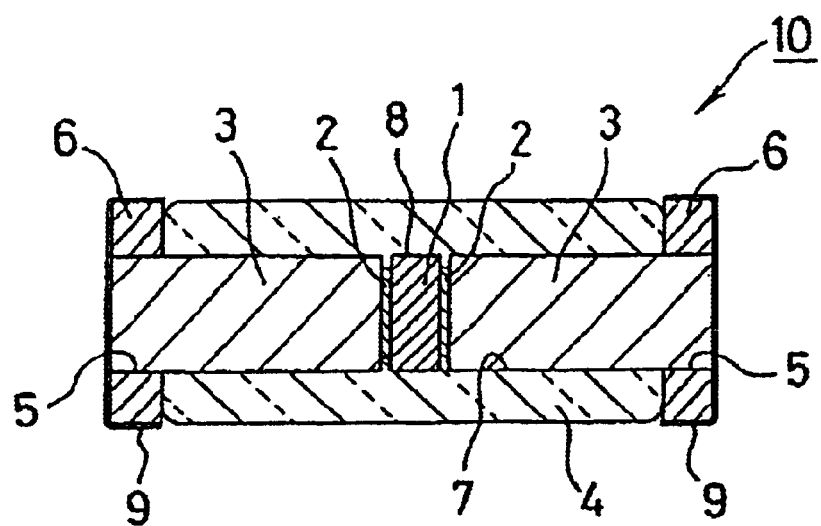
FIG. 1 is a transverse section showing an embodiment of the present invention.

Preferred embodiments of the present invention will be described in detail below with reference to FIGS. 1–3 (giving the same reference numerals to the same parts). The below-described embodiments are simply suitable specified examples of the present invention. Therefore, though various technically preferred limitations are given, the scope of the invention is not limited to these embodiments so long as a special description for limiting the invention is not given in the following explanation.

Figure 2:
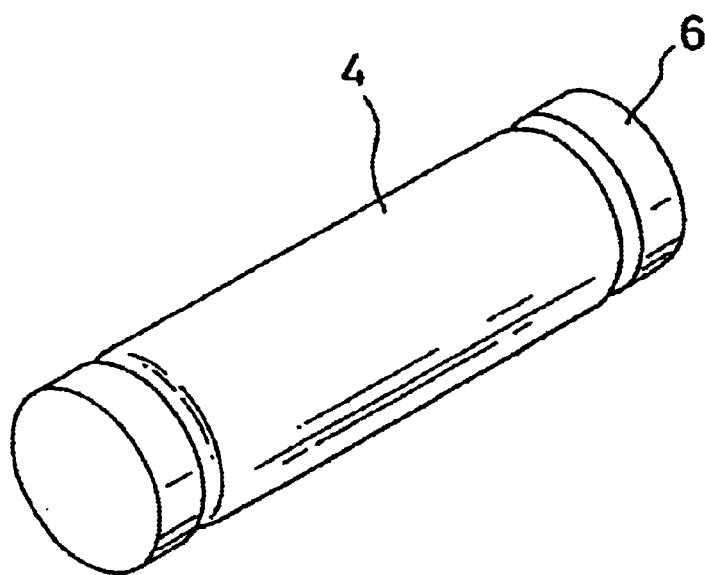
FIG. 2 is a perspective view showing the embodiment of the present invention.

FIG. 1 is a transverse section showing an embodiment of the present invention and FIG. 2 is its perspective view. FIG. 3 is a partial cross-sectional view showing a glass-sealed light-emitting diode of the present invention implemented on a printed circuit board. As shown in FIG. 1, the glass-sealed light-emitting diode comprises an LED bare chip 1 having opposite surfaces, which are provided with electrodes 2 for supplying power from external. A pair of durnet wires 3 are each connected to the respective electrodes 2 sandwiching the LED bare chip 1 therebetween. A glass seal 4 is employed to seal the LED bare chip 1, the electrodes 2 and parts of the dumet wires 3 integrally. A pair of metallic disc plates 6, having holes 5 formed through the center, are secured on both sides of the glass seal 4, allowing the pair of dumet wires 3 to project from the glass seal 4, passing through the holes 5. These plates 6 have solder-plated outer sides and circumferential surfaces. The pair of dumet wires 3 are cut in such a manner that they can not project beyond the metallic plates 6 after passing through the holes 5 of the metallic plates 6.

In an exemplary method of producing the above-described glass-sealed light-emitting diode 10, the LED bare chip 1 having opposite surfaces provided with the electrodes 2 is sandwiched between the pair of dumet wires 3 via the electrodes 2. The LED bare chip 1 is then secured in a hole 7 formed through the center of the glass seal 4.

The glass seal 4 is then heated and melted to fill gaps located between the glass seal 4, the LED bare chip 1 and the dumet wires 3 to contact the glass seal 4 directly with the LED bare chip 1 and form an interface therebetween. Thereafter, the glass seal 4 is cooled to complete the glass-sealed LED bare chip 1. In this case, when the glass seal 4 contracts at the time of cooling, the dumet wires 3, which contacts the electrodes 2 on the LED bare chip 1, suffer stresses toward the LED bare chip 1. As a result, the electrodes 2 on the LED bare chip 1 and the dumet wires 3 have firm contact and reliable continuity therebetween.

After the glass seal 4 is cooled, the metallic plates 6 having the holes 5 formed in the center are fixedly secured on both sides of the glass seal 4. In this case, the pair of dumet wires 3 projecting from both sides of the glass seal 4 are allowed to pass through the holes 5 in the metallic plates 6. Then, the dumet wires 3 are cut off so as not to project beyond the metallic plates 6.

Finally, solder plating 9 is applied to surfaces of the metallic plates 6 disposed at the both sides of the glass seal 4 and to the ends of the dumet wires 3 to complete the glass-sealed light-emitting diode 10.

The glass-sealed light-emitting diode of the present embodiment has a cylindrical appearance as shown in FIG. 2. In this case, the both sides of the glass seal 4 are provided with the solder-plated metallic plates 6 that serve as the electrodes for supplying power via the dumet wires to the LED bare chip that is glass-sealed 4.

Figure 3:
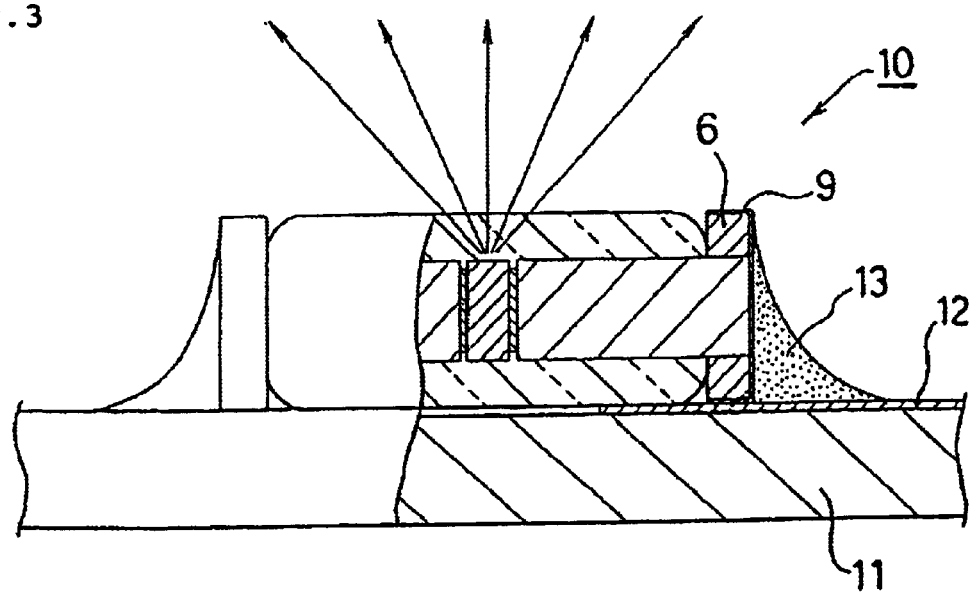
FIG. 3 is a partial cross-sectional view showing a glass-sealed light-emitting diode of the present invention implemented on a printed circuit board.
Figure 4:
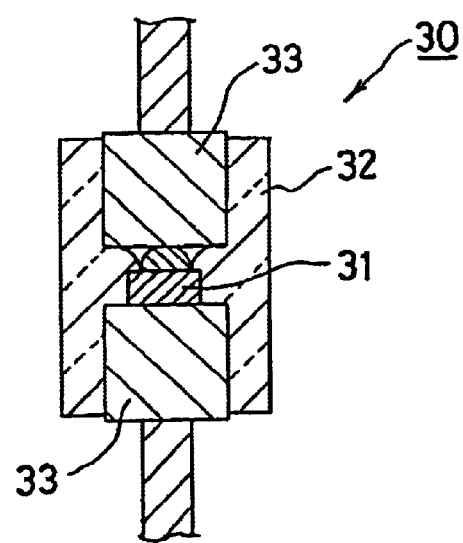
FIG. 4 is a cross-sectional view showing a conventional glass-sealed light-emitting diode.

FIG. 3 is a partial cross-sectional view showing the glass-sealed light-emitting diode of the present invention implemented on a printed circuit board. On the printed circuit board 11, circuit electrodes 12 for anode and cathode are formed with a conductive material. The glass-sealed light-emitting diode 10 is arranged on the printed circuit board 11 so that the metallic plates 6 solder-plated 9, which serve as the electrodes of the glass-sealed light-emitting diode 10, are located on the circuit electrodes 12. Then, the circuit electrodes 12 on the printed circuit board 11 and the metallic plates 6 solder-plated 9 and formed on the glass-sealed light-emitting diode 10 are soldered 13 to make electrical conduction therebetween. As a result, when a voltage is applied across the circuit electrodes 12 on the printed circuit board 11 (circuit electrodes on one side are not shown), a current flows into the glass-sealed light-emitting diode 10 implemented on the printed circuit board 11, which emits light.

In the above embodiment, the portions to be soldered to the printed circuit board are exemplified as the metallic plates. Alternatively, such a member that includes an insulated substrate and a metallic layer formed on the surface may be employed to achieve the similar effect.

Desirably, the glass seal is composed of a soft glass material.

The molten glass seal may be molded in a polygonal column when it is cooled. In addition, the metallic plates may be shaped in a polygon similar to the section of the glass seal in the shorter direction to achieve a glass-sealed light-emitting diode with an appearance of a polygonal columnar. In this case, in consideration of the sizes as an optical semiconductor component and the mold accuracy of glass, desirable shapes may be determined between a tetragonal column and a hexagonal column.

As described above, in the glass-sealed light-emitting diode of the present invention, the LED bare chip is hermetically glass-sealed. Therefore, in comparison with the resin-sealed light-emitting diode, external moisture, which negatively influences the durability of the LED bare chip, can be prevented from penetrating so as to retain high reliability over a long time period. In addition, glass having a larger refractive index compared to air, is in direct contact with the emission surface of the LED bare chip.

Accordingly, even when light emitted from the active region of the LED bare chip arrives at the emission surface of the LED bare chip at a relatively larger critical angle, it can be output into the glass. Thus, a light-emitting diode with a high external quantum efficiency can be achieved. Further, the glass-sealed light-emitting diode of the present invention is surface-mountable on the printed circuit board. Accordingly, it can be implemented integrally (i.e. mounted) with other surface mounting components. Thus, a single-sided printed-circuit board can be employed to educe the cost of the printed circuit board and the processes of mounting components can be simplified to reduce assembly cost, resulting in reduced production cost of a final product that incorporates components mounted thereon. If the light-emitting diode is shaped in a polygonal column, when it is positioned on the printed circuit board for mounting thereon, it can not be displaced easily, even if the printed circuit board vibrates. Thus, the light-emitting diode can be mounted on an intended location reliably. These are many excellent effects achievable by the present invention.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed:

1. A glass-encapsulated light-emitting diode, comprising:
   an LED bare chip;
   a pair of electrodes, each connected to said LED bare chip on an opposite side thereof;
   a pair of lead-in wires, each connected to one of said electrodes and thereby arranged for said LED bare chip to be interposed between said lead-in wires along an electrode direction; and
   a pair of metallic members, each defining a hole through the center thereof, and
   a glass encapsulation encapsulating said LED bare chip, said electrodes and at least a part of said lead-in wires, wherein:
   each said metallic member is separately secured at a respective end of said glass encapsulation and
   each said lead-in wire extends from said glass encapsulation, into said hole in a respective one of said metallic members, but not beyond the end of said metallic member distal from said glass encapsulation.

2. The glass-encapsulated light-emitting diode according to claim 1, wherein glass for said glass encapsulation is composed of soft glass.

3. The glass-encapsulated light-emitting diode according to claim 1 further comprising a solder plating on at least the ends of the metallic members distal from the glass encapsulation and on the ends of the lead-in wires distal from the glass encapsulation.

* * * * *

UNITED STATES PATENT AND TRADEMARK OFFICE
CERTIFICATE OF CORRECTION

PATENT NO. : 6,911,678 B2
APPLICATION NO. : 10/658973
DATED : June 28, 2005
INVENTOR(S) : Shigeo Fujisawa et al.

It is certified that error appears in the above-identified patent and that said Letters Patent is hereby corrected as shown below:

Column 3, line 30, "durnet" should read --dumet--;

Column 3, line 52, "interface therebetween." should read --interface 8 therebetween.--; and Column 5, line 10, "educe" should read --reduce--.

Signed and Sealed this

Eighth Day of August, 2006

JON W. DUDAS
*Director of the United States Patent and Trademark Office*